United States Patent [19]
Scholl

[11] Patent Number: 6,007,879
[45] Date of Patent: Dec. 28, 1999

[54] ADJUSTABLE ENERGY QUANTUM THIN FILM PLASMA PROCESSING SYSTEM

[75] Inventor: Richard A. Scholl, Fort Collins, Colo.

[73] Assignee: Advanced Energy Industries, Inc., Fort Collins, Colo.

[21] Appl. No.: 08/766,570

[22] Filed: Dec. 12, 1996

Related U.S. Application Data

[63] Continuation of application No. 08/418,840, Apr. 7, 1995, abandoned.

[51] Int. Cl.[6] .............................. C23C 14/00; H05H 1/00; H05H 1/24
[52] U.S. Cl. .............................. 427/562; 427/8; 427/535; 427/569; 204/192.12; 204/192.13; 204/192.3; 204/192.32; 204/192.33; 216/71
[58] Field of Search .................................. 427/535, 536, 427/537, 539, 569, 570, 571, 572, 573, 545, 580, 8; 204/192.13, 192.12; 216/67, 68, 69, 70, 71

[56] References Cited

U.S. PATENT DOCUMENTS

| | | | |
|---|---|---|---|
| 3,071,667 | 1/1963 | Lee | 260/144 |
| 3,260,892 | 7/1966 | Berghaus et al. | 315/306 |
| 3,392,304 | 7/1967 | Anderson | 315/14 |
| 3,400,207 | 9/1968 | Andersen | 373/12 |
| 3,445,782 | 5/1969 | Sonkin | 330/124 |
| 3,544,913 | 12/1970 | Anderson | 328/267 |
| 3,546,606 | 12/1970 | Anderson et al. | 328/267 |
| 3,609,200 | 9/1971 | Anderson | 373/12 |
| 3,748,536 | 7/1973 | Andersen | 361/57 |
| 3,783,231 | 1/1974 | Sablev et al. | 219/123 |
| 3,793,179 | 2/1974 | Sablev et al. | 204/298 |
| 3,839,182 | 10/1974 | Sager | 204/298 |
| 4,103,324 | 7/1978 | Vanderwelden et al. | 363/89 |
| 4,181,541 | 1/1980 | LeFrancois | 148/16.6 |
| 4,194,930 | 3/1980 | Tanaka et al. | 148/16.6 |
| 4,333,962 | 6/1982 | Pulker et al. | 204/177 |
| 4,383,203 | 5/1983 | Stanley | 315/248 |
| 4,396,478 | 8/1983 | Aizenshtein et al. | 204/192 R |
| 4,448,659 | 5/1984 | Morrison, Jr. | 204/192.38 |
| 4,449,799 | 5/1984 | Bergman et al. | 427/37 |

(List continued on next page.)

FOREIGN PATENT DOCUMENTS

| | | | |
|---|---|---|---|
| 0 186 865 | 7/1986 | European Pat. Off. | H01J 37/32 |
| 0 528 163 A1 | 2/1993 | European Pat. Off. | H01J 32/37 |
| 0 553 410 | 8/1993 | European Pat. Off. | C23C 14/35 |

(List continued on next page.)

OTHER PUBLICATIONS

Benjamin, "Use Hybrid Junctions For More VHF Power", *Electrical Design 16*, pp. 54–59, Aug. 1, 1968.
Johnson, "Solid–State Amplifier Delivers Reliable Meteor–Burst Communication", *MSN & CT*, pp. 8,9,12,16, no date.
Nicas, "Planar Power Combining for Medium Power GaAs FET Amplifiers in X/Ku–Bands", *Microwave Journal* vol. 22, No. 2, pp. 79–84, no date.

(List continued on next page.)

*Primary Examiner*—Marianne Padgett
*Attorney, Agent, or Firm*—Santangelo Law Offices, P.C.

[57] ABSTRACT

A method of thin film plasma processing which includes multiple power environments and circuitry is described so as to encompass a variety of configurations. The environments may establish an energy quantum which may be interactively adjusted such as for conditioning or processing when new targets or materials are inserted. The energy quantum can be increased from the traditionally low energy storage of a switch-mode power supply to a higher energy to allow more intense arc occurrences and, thus, the more rapid conditioning of a target. Switching between environments can be achieved manually or automatically through timing or through arc or plasma electrical characteristics sensing. Energy quantum may be adjusted through the inclusion of energy storage elements, hardwired elements, or through software configurations such as are possible with the utilization of a programmable processor. Applications for DC switch-mode thin film processing systems are specifically shown.

33 Claims, 3 Drawing Sheets

6,007,879
Page 2

U.S. PATENT DOCUMENTS

| | | | |
|---|---|---|---|
| 4,452,828 | 6/1984 | Namba et al. | 427/573 |
| 4,500,563 | 2/1985 | Ellenberger et al. | 427/578 |
| 4,559,125 | 12/1985 | Mularie | 204/298 |
| 4,587,430 | 5/1986 | Adler | 250/423 R |
| 4,590,436 | 5/1986 | Butler et al. | 330/277 |
| 4,590,437 | 5/1986 | Butler et al. | 330/277 |
| 4,610,775 | 9/1986 | Phifer | 204/298 |
| 4,620,913 | 11/1986 | Bergman | 204/192.1 |
| 4,631,493 | 12/1986 | Vendelin et al. | 330/227 |
| 4,693,805 | 9/1987 | Quazi | 204/192.22 |
| 4,695,933 | 9/1987 | Nguyen et al. | 363/17 |
| 4,710,694 | 12/1987 | Sutphin | 320/22 |
| 4,711,767 | 12/1987 | Diederich | 422/186 |
| 4,762,756 | 8/1988 | Bergmann et al. | 427/570 |
| 4,764,394 | 8/1988 | Conrad | 427/527 |
| 4,792,730 | 12/1988 | Mintchev et al. | 315/209 |
| 4,794,506 | 12/1988 | Hino et al. | 363/25 |
| 4,828,934 | 5/1989 | Pinkhasov | 427/580 |
| 4,842,710 | 6/1989 | Freller et al. | 427/580 |
| 4,931,169 | 6/1990 | Scherer et al. | 204/298.11 |
| 4,936,960 | 6/1990 | Siefkes et al. | 204/192.38 |
| 4,963,238 | 10/1990 | Siefkes et al. | 204/192.12 |
| 4,980,810 | 12/1990 | McClanahan et al. | 363/16 |
| 4,981,566 | 1/1991 | Wurczinger et al. | 204/192.13 |
| 5,001,620 | 3/1991 | Smith | 363/89 |
| 5,006,213 | 4/1991 | Sichman et al. | 204/192.14 |
| 5,009,764 | 4/1991 | Siefkes et al. | 204/298.08 |
| 5,015,493 | 5/1991 | Gruen | 427/38 |
| 5,034,973 | 7/1991 | Ishiyama | 378/114 |
| 5,074,984 | 12/1991 | Sichman et al. | 204/298.04 |
| 5,103,766 | 4/1992 | Yoshikawa et al. | 427/580 |
| 5,108,571 | 4/1992 | Ludwig et al. | 204/192.13 |
| 5,118,997 | 6/1992 | El-Hamamsy | 315/248 |
| 5,121,084 | 6/1992 | Anderson et al. | 330/295 |
| 5,126,033 | 6/1992 | Szcyrbowski et al. | 204/298.08 |
| 5,192,578 | 3/1993 | Ramm et al. | 427/578 |
| 5,192,894 | 3/1993 | Teschner | 315/111.21 |
| 5,212,425 | 5/1993 | Goebel et al. | 315/111.21 |
| 5,241,152 | 8/1993 | Anderson | 219/121.57 |
| 5,281,321 | 1/1994 | Sturmer et al. | 204/298.08 |
| 5,286,360 | 2/1994 | Szczyrbowski | 204/298.08 |
| 5,300,205 | 4/1994 | Fritsche | 204/192.12 |
| 5,302,422 | 4/1994 | Nowak et al. | 427/533 |
| 5,303,139 | 4/1994 | Mark | 383/63 |
| 5,306,407 | 4/1994 | Hauzer et asl. | 427/580 |
| 5,306,986 | 4/1994 | Siao | 315/248 |
| 5,357,418 | 10/1994 | Clavel | 363/89 |
| 5,367,448 | 11/1994 | Carrol | 363/89 |
| 5,399,252 | 3/1995 | Scherer et al. | 204/298.19 |
| 5,427,669 | 6/1995 | Drummond | 204/298.08 |
| 5,478,456 | 12/1995 | Humpal et al | 204/192.13 |
| 5,507,930 | 4/1996 | Yamashita et al. | 204/192.15 |
| 5,535,906 | 7/1996 | Drummond | 216/67 |
| 5,549,795 | 8/1996 | Gregoire et al. | 204/164 |
| 5,576,939 | 11/1996 | Drummond | 363/16 |
| 5,584,972 | 12/1996 | Lantsman | 204/192.12 |
| 5,584,974 | 12/1996 | Sellers | 204/298.03 |
| 5,616,224 | 4/1997 | Boling | 204/298.08 |
| 5,616,225 | 4/1997 | Sieck et al. | 204/298.14 |
| 5,645,698 | 7/1997 | Okano | 204/192.12 |
| 5,718,813 | 2/1998 | Drummond et al. | 204/192.12 |
| 5,747,935 | 5/1998 | Porter et al. | 315/111.51 |

FOREIGN PATENT DOCUMENTS

| | | | |
|---|---|---|---|
| 0564789A1 | 10/1993 | European Pat. Off. | H01J 37/32 |
| 0567954 | 11/1993 | European Pat. Off. | C23C 14/08 |
| 0 591 675 A1 | 4/1994 | European Pat. Off. | H01J 37/34 |
| 0591675A1 | 4/1994 | European Pat. Off. | H01J 37/34 |
| 2 648 001 | 12/1990 | France | H05H 1/24 |
| 2648001 | 12/1990 | France | H05H 1/24 |
| 2422808 | 5/1974 | Germany . | |
| 221-202 | 4/1985 | Germany | C23C 14/38 |
| 229-160 | 10/1985 | Germany | C23C 14/38 |
| 3919147A1 | 6/1989 | Germany | C23C 14/35 |
| 31 21 389 | 8/1992 | Germany . | |
| 41 13 704 | 10/1992 | Germany | C23C 14/34 |
| 4127505A1 | 2/1993 | Germany | H05H 1/36 |
| 4438463C1 | 2/1996 | Germany | H05H 1/46 |
| 5 7069-324 | 4/1982 | Japan . | |
| 60050170 | 3/1985 | Japan | C23C 16/50 |
| 6 1030-665 | 2/1986 | Japan | C23C 14/40 |
| 61-030665 | 2/1986 | Japan | C23C 14/34 |
| 6 3190-168 | 8/1988 | Japan | C23C 14/34 |
| 1-14312 | 3/1989 | Japan . | |
| 91-265148 | 10/1990 | Japan | H03K 3/53 |
| 3-61368 | 3/1991 | Japan | C23C 14/54 |
| 3056-671 | 3/1991 | Japan | C23C 14/40 |
| 6-145973 | 5/1994 | Japan | C23C 14/34 |
| 1134562 | 11/1968 | United Kingdom | H01J 41/00 |
| 2045553 | 10/1990 | United Kingdom | H02J 1/00 |
| WO 91/15027 | 10/1991 | WIPO | H01J 37/32 |
| WO 94/16458 | 7/1994 | WIPO | H01J 37/34 |
| WO 94/23440 | 10/1994 | WIPO | H01J 37/34 |

OTHER PUBLICATIONS

"Optical Society of America Annual Meeting," 1992 Technical Digest series, vol. 23, (Abstract, New Method of Arc Suppression . . . , Williams, Sep. 1992.

*Electric Circuits,* ISBN 0–201–06238–0, 1983, Nilsson, James, pp. 160, 161, 165 (2d ed.), pp. 82–149 (chapter 4).

Derwent Abstract of SU 1,598,128, patent published Oct. 1990.

Abstracts of Japan, patent # JP 60050170, patent pub. date Mar. 1985.

"New Method of Arc Suppression for Reactive DC Magnetron Sputtering," Optical Society of America Annual Meeting, Sep. 20–25, 1992; 1992 Technical Digest Series vol. 23, pp. 1–6.

The MDX as Strategic Tool in Reducing Arcing; Doug Schatz 1985; pp. 1–7; Advanced Energy Industries Application Notes no month.

Economical Considerations on Modern Web Sputtering; S. Beiswenger, et al.; 1992; pp. 128–134; Society of Vacuum Centers, 35th Annual Technical Conference Proceedings, no month.

A New Technique for Arc Control in DC Sputtering; L. Anderson, Holman Electronics, Inc. 1992; pp. 325–329; Society of Vacuum Coaters 35th Annual Technical Conference Proceedings.

"Arching Problems Encountered During Sputter Deposition of Aluminum," Thomas C. Grove, Application Note Issued by Advanced Energy Industries, Inc., Fort Collins, CO 1986, no month.

Press Release, "New Arc–Check™ Provides Sustained Arc Control," Advanced Energy Industries, Inc., Fort Collins, CO., Jan. 14, 1988.

"MDX–10K Series DC Magnetron Drives," Advanced Energy Industries, Inc., Fort Collins, CO., Jan. 14, 1988.

ADJUSTABLE ENERGY QUANTUM THIN FILM PLASMA PROCESSING SYSTEM

This application is a continuation of U.S. patent application Ser. No. 08/418,840 filed Apr. 7, 1995, now abandon.

BACKGROUND OF THE INVENTION

This invention relates generally to the field of thin film processing through the use of a plasma. Specifically, the invention relates to the occurrence of arcs and the reaction to these arcs such as exist in the initial conditioning of a target material for such processing. It discloses designs which are particularly suited to direct current (DC) operations especially those which involve the application of a switch-mode power supply.

The field of thin film plasma processing is well known. In this field, a power supply creates an AC or DC electric potential which causes the existence of a distributed plasma. The plasma then acts upon some area of material so as to cause processing of an item or substrate. This processing may be deposition, etching, or some other type of processing. Depending on the particular application being pursued, the materials, substrates and even the nature of the processing can vary greatly.

One of the challenges that exists for precise processing is the need to establish a target material in a relatively homogeneous state. This is important because when anomalies exist, areas of low impedance can be created and the plasma may begin to discharge or arc into such areas. Unlike situations in which a cathodic arc is desirable (an undistributed plasma), in such plasma processing applications (defined here as "non arc-based" plasma processing), the existence of arcs can be undesirable. The arcs can negatively impact the desired processing; they can create areas where precise control is not possible. For these and other reasons it has become customary—and often preferred—to use power supplies having very rapid process control capabilities and having very precise energy control. In DC applications this is often achieved through the utilization of switch-mode power supplies. These power supplies act to create DC power which is derived from a high frequency source. This not only affords the opportunity for rapid reaction to plasma conditions but it also allows for very low energy storage so as to minimize the effects caused by arc occurrences within the plasma.

An important aspect in many plasma processing applications is that of conditioning the target or material so that it may be used to achieve more precise processing. Not only are solid targets periodically replaced as they wear down but also they can be removed to allow different processing to occur. In each of these instances, the replaced target can tend to exhibit a tendency to arc as surface anomalies are eliminated. These anomalies may consist of unclean areas (such as fingerprints and the like) or topographic anomalies (such as scratches and the like). Regardless of their source it is not uncommon that target materials need to be conditioned before production line processing can occur.

In applications where not particularly precise processing is required, this conditioning is merely a nuisance. For instance, in the manufacture of products utilizing high energy storage power supplies, it is not atypical to merely throw away the first few products until a new target is properly conditioned. This can take a few seconds and may not be that expensive. Unfortunately in applications where precise plasma processing is desired such as through the utilization of low energy storage power supplies, this conditioning can take thousands of times longer and can result in the disposal of thousands of times more products due to imperfect processing. For instance in the coating of compact disks, rather than merely disposing of a few disks taking a few seconds, when low energy supplies are used, it can be necessary to dispose of many disks over the course of half an hour's run just to condition the target material. Obviously this is undesirable. Other applications can be more extreme as even a single semiconductor wafer may cost almost one hundred thousand dollars. Conditioning in these applications can also take a full day.

Unfortunately, until the present invention no system existed which both achieved quick and efficient conditioning of a target while also achieving the enhanced processing accuracies possible with a low energy storage power supply. Perhaps surprising in this regard is the fact that although there has been a recognized need to achieve both these criteria, this need has remained unsatisfied until the present invention even though the implementing arts and elements had long been available.

This is perhaps due to the fact that those skilled in the art of thin film and non arc-based plasma processing did not fully appreciate the nature of the problem and so were not able to achieve the solutions of the present invention. This also may have been due to the fact that those skilled in the art actually accepted directions which were away from the teaching of the present invention. One of these accepted directions was fueled by the perception that particularly delicate target handling and/or the a need to dispose of a large number of initial product runs was merely a requirement for accurate processing. Although discussed earlier in reference to low energy storage power supplies, even this realization was not fully appreciated. Perhaps also showing the degree to which those skilled in the art accepted and were directed toward handling solutions is also evidenced by the fact that until the present invention it appears that no efforts were made to achieve proper conditioning through a variation of the application of power to the plasma. Thus, until the present invention it simply was not possible to achieve both practical conditioning of a target as well as precise processing through the utilization of a low energy storage power supply such as a switch-mode power supply.

SUMMARY OF THE INVENTION

Accordingly, the present invention provides a thin film plasma processing system in which the power supply of the system acts to apply different power environments. These environments can act to condition new or replaced targets. The power supply can then switch to a different power environment during the processing event to allow as accurate production processing as possible. In one embodiment, a thin film processing power supply according to this invention can switch either automatically or manually from a conditioning environment to a processing environment. As discussed later, this switching can act to effectively adjust an energy quantum for the thin film plasma processing system through a number of ways.

Thus, it is an object of the invention to achieve the elimination of imperfections in a solid target material through operation of the supply of power. In keeping with this object is a goal to rapidly eliminate low impedance areas so that precise processing may be instituted at the earliest possible time. It is also a goal to reduce the number of arc occurrences and the interruptions which the processing system experiences. Further, a goal is to provide efficient conditioning of a target in practically implementable systems.

Yet another object of the invention is to provide a system which is capable of simultaneously achieving efficient target conditioning and extremely precise processing without compromising either. In keeping with this object it is also a goal to provide designs which are easily implemented for existing systems and to provide systems which may either manually or automatically switched between environments as desired.

A further object of the invention is to provide a thin film processing system in which the energy quantum can not only be established but also adjusted during operation of the system. In keeping with this object it is a goal to provide a variety of ways to achieve these effects without impacting the ability for precise processing.

Naturally further objects of the invention are disclosed throughout other areas of the specification and claims.

DETAILED DESCRIPTION OF THE PREFERRED EMBODIMENTS

Figure 1:
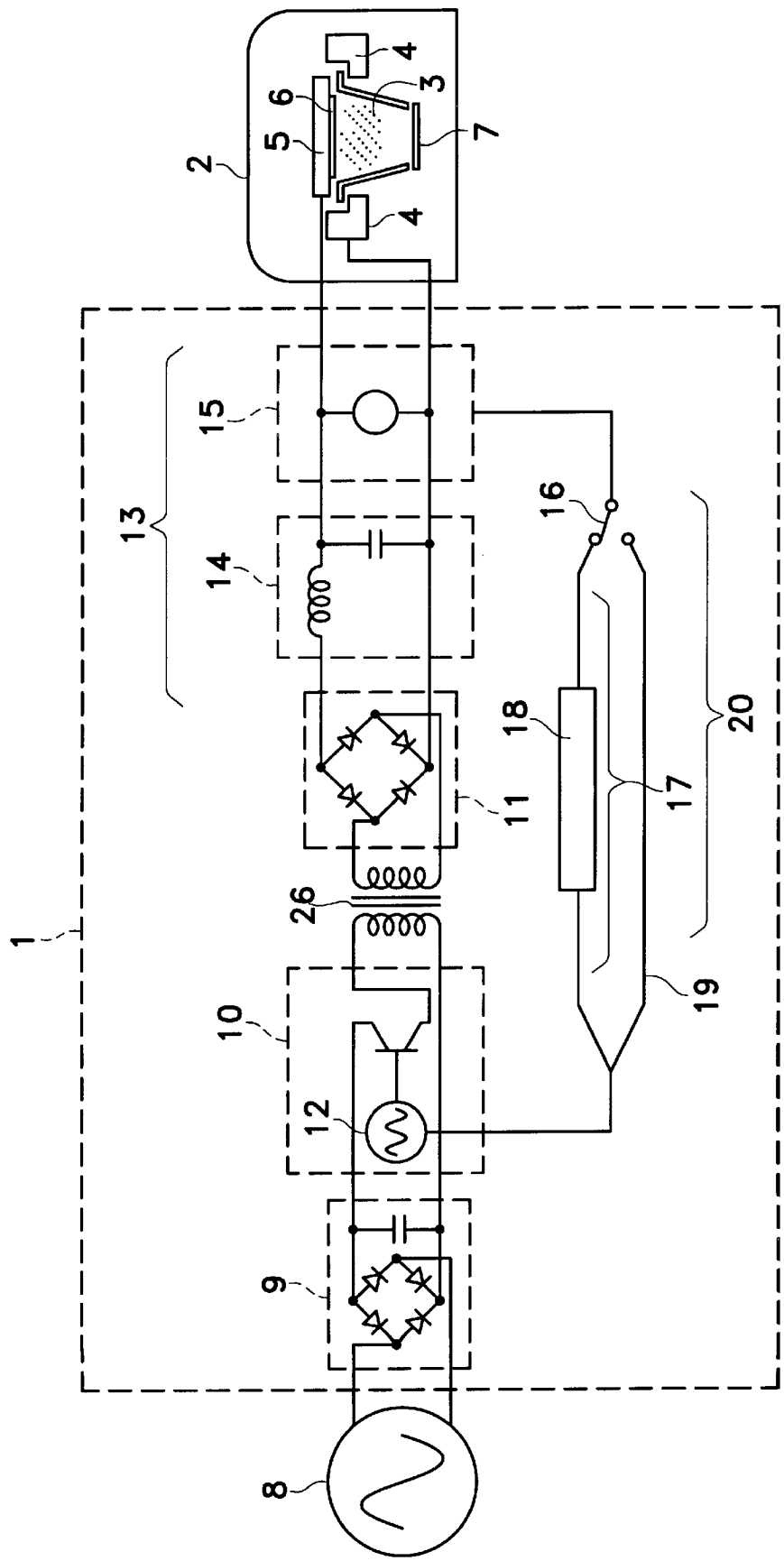
FIG. 1 is a schematic diagram of the basic components of a switch-mode system implementing a reaction time-based configuration according to the present invention.

As can be seen from the drawings the basic concepts of the present invention may be embodied in many different ways. FIG. 1 shows a basic thin film processing system according to one embodiment of the present invention. As shown, it can be seen that power source (1) applies power to processing chamber (2) within which plasma (3) is created. Plasma (3) is created through the action of anode (4) and cathode (5) within processing chamber (2) so that it may affect solid material (6) as desired. This material may then act to process some type of substrate (7). As mentioned earlier, in some instances arcs can occur between plasma (3) and material (6). These occurrences can cause an inordinate release of material or can cause other affects which may negatively impact or even destroy the item to be produced such as substrate (7).

Although the invention may be applied to AC and DC processing, as also shown in FIG. 1, the power source (1) may be designed as a DC power source. It may also be a relatively low energy source such as the switch-mode power source shown schematically. As is well known, such configuration may involve utilizing an AC source (8) such as publicly available power. The AC power supply may then be converted to a DC input voltage through the use of some type of rectifier (9). The resulting DC input voltage may then be converted to a DC output through the use of an AC generator (10) and an AC to DC converter (11). As is well known, the generator may have a high frequency driver (12) for the precise process control desired. FIG. 1 shows a transformer (26) which may or may not be included between the AC generator (10) and the AC to DC converter (11) for voltage transformation and isolation, if desired. Further, once a DC output is created from the AC to DC converter (11), that output may then be further conditioned by a DC output stage (13) which may include a matching network, a filter (14), and even some type of feedback sensing system (15).

In basic form, such a switch-mode configuration acts to convert the DC input voltage to a DC output voltage through the intermediate generation of an alternating signal. As those skilled in the art readily understand, such a configuration affords not only the opportunity for rapid reaction to plasma variations but also the possibility of storing much lower energy in the output stage (13) such as in the reactive or energy storage elements shown in filter (14). These advantages, however, are recognized in the present invention to be a source of difficulty with respect to the conditioning of the material (6).

Importantly, the present invention recognizes the possibility of utilizing the application of power to the processing chamber (2) for a variety of purposes including, but not limited to, the conditioning of material (6). This is achieved through the power source applying multiple power environments depending upon the circumstances and applications involved. As shown in FIG. 1, the system is configured so as to allow more than one power environment, a conditioning environment, or even different power supply control system to achieve the ends desired. As shown in FIG. 1, the power control system can conceptually include a switch (16). This switch (16) can allow active changeover between different environments, different circuitry, or different power control systems.

As shown in FIG. 1, the switch (16) is configured to establish a non-traditional power environment. This is achieved through the use of conditioning circuitry (17) which acts as one way to create a different power control system. Conditioning circuitry (17) may include some type of delay circuitry or timer (18), among other aspects as discussed later.

Conversely, when switch (16) is connected to the other line, a second power environment will be created through the activation of processing circuitry (19). As shown in FIG. 1, processing circuitry (19) may provide a traditional power environment by direct connection. In this environment signals output from feedback sensing system (15) would act to immediately cause the power supply to react to any variations. Naturally, it should be understood that although feedback sensing system (15) and processing circuitry (19) are shown with particular connections, these connections are intended to be merely illustrative of a general concept which may achieved in a host of different ways. Either end may be configured very differently and still achieve the same result. This is well understood by those having ordinary skill in the art. All known ways for achieving a reaction from power source (1) to any variations within processing chamber (2) are encompassed by this patent. The present illustration is designed for simple understanding only and is not intended to limit the scope of this patent. Further, it should also be understood that through the broad terms "power environment" and "power control system", a host of different alternatives are also encompassed other than the merely different regulation modes ( i.e. current or voltage regulation) or merely shutting down or reversing the supply. This is illustrated in part by the discussion later with respect to the various alternative designs which might achieve one type of environment, namely a conditioning environment. Again, this term should not be interpreted as a limiting term as a host of different power environments achieving a variety of different purposes are encompassed by this patent. Differential processing or even different coating or etching can be achieved by any number of power environments through the teachings of this invention.

As shown in FIG. 1, multiple power environments (in this case two) are created through the operation of power source (1). As shown, a simple second power environment, namely, one which provides traditional, precisely controlled power can be used for processing within the processing chamber (2). Although some processing may naturally occur during the operation of a first, preparatory power environment (which could be a conditioning environment), the bulk of the processing can occur primarily through the action of the second power environment as those skilled in the art would readily appreciate. Further, it may also be possible to configure the design, or even the throughput of substrate (7) so that processing only occurs through the second processing environment.

As mentioned earlier, while it is expected that the primary need for the present invention will occur when material (6) is first introduced to processing chamber (2), it should also be understood that conditioning or a different power environment may be instituted at any time during a processing event. This processing event may or may not include the continuous application of power. In instances in which it does include the continuous application of power the present invention allows the unique opportunity to switch between environments while the power source is continuously operating. Thus, there is no need to shut off power source (1) in order to achieve switching between various environments. This is a sharp departure from the prior art where changes in environments, while theoretically possible, would appeared to have required the complete shutdown of power supply (1) in order to achieve such a change. In this fashion the invention and the power control systems can act while power source (1) is operating.

Perhaps the most fundamental realization which led to the present invention was the fact that traditional low energy storage power supplies were not optimum for the conditioning of material (6). This was a departure from the teaching of those in the prior art where it was generally understood that the lower the energy storage, the better. If we define the amount of energy delivered by the supply to an arc as an energy quantum, the low energy storage represents a small energy conditioning effect that the arc occurrences can have on material (6). Thus, the present invention can adjust the magnitude of the energy quantum it supplies to achieve a different power environment. The differences in arc energy quantum create the different environments. Although those having ordinary skill in the prior art had generally assumed that it was never desirable to allow greater amounts of energy to be stored in or provided by output stage (13) or even the power supply, the present invention shows that it may be desirable to increase either the storage or the amount of energy dumped into an arc to achieve conditioning. In fact, the essence of the device shown in FIG. 1 is that switch (16) acts to adjust the arc energy quantum of the power environment. This energy quantum is increased through delay circuitry (18) when power source (1) is operated in a first environment such as the conditioning environment shown. By altering this energy quantum, the system purposefully allows more intense arc occurrences to occur during a conditioning event. Once this is achieved, the system can then switch to the traditional low energy storage for processing. Such variations also allow the possibility of avoiding a higher current while allowing a higher energy as well.

As mentioned earlier, there are a host of different ways to achieve a power environment which adjusts or alters the energy quantum involved. One technique is to alter the reaction time with which power source (1) operates. This can occur through changing a driver's pulse width or through pure timing. Again, as mentioned earlier although it has been previously assumed that the fastest reaction time is always the best in such a system, the present invention shows that such is not always the case. Specifically, the invention can act to delay the reaction time to an arc occurrence so that more energy may be provided to the arc. By changing the reaction time through the utilization of some type of delay circuitry or timer (18), the energy quantum can be altered. Thus, the first power control system has a reaction time which is different from the second power control system (the traditional direct connection shown as processing circuitry (19). The thin film plasma processing system can also generically include a variable reaction control (20) which acts to change the reaction time of the system based upon the particular environment desired.

Figure 2:
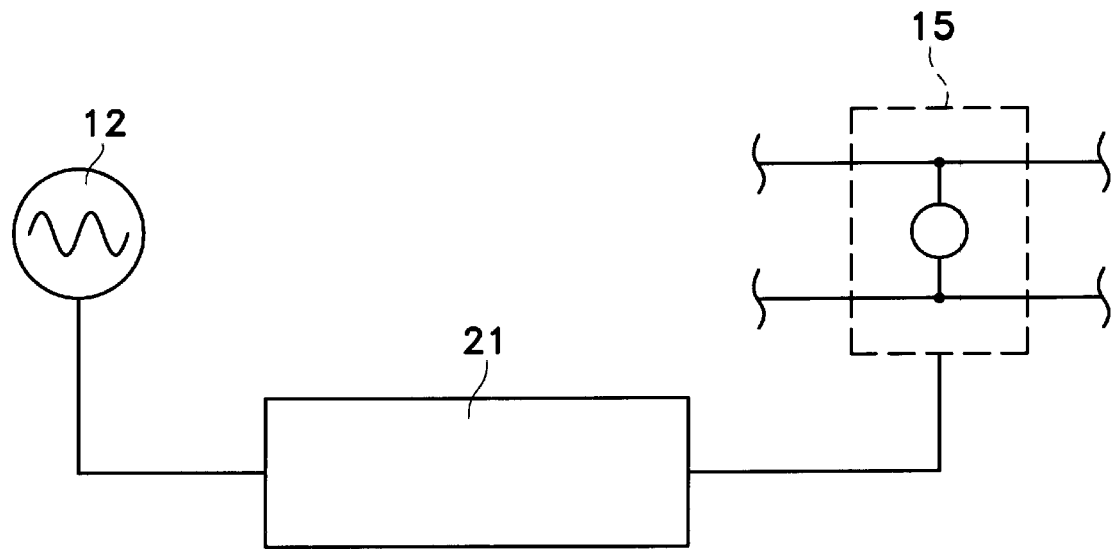
FIG. 2 is a schematic diagram of a programmable processor component configured to implement the invention.

Naturally, it should be understood that the variable reaction control (20) may be comprised of circuit elements, a rheostat, or even some type of software configuration. FIG. 1 shows merely one type of circuit element, namely, some type of delay circuitry (18). This delay circuitry may be any type of component ranging from components which take some specific amount of time to charge to a traditional timer or to even some type of counter device. Alternatively, as shown in FIG. 2, it should be understood that the variable reaction control (20) may also encompass the utilization of software through some type of programmable processor (21). As might be easily implemented, programmable processor (21) may include programming which acts to delay the onset of a feedback response based upon the particular environment involved. Such an implementation would be very easily achieved by those skilled in the art with access to the various resources available. In this fashion it should be understood that both hardware and software implementations are encompassed by this patent.

Further, the switch (16) shown in FIG. 1 may be a traditional switch, a gate of some sort, or may merely be a programming change. As shown in FIG. 1, the variable reaction control (20) can be responsive to switch (16) so that it may implement the different reaction times and thus achieve a change in the energy quantum as desired. During operation, power source (1) would thus act to respond to delay circuitry or timer (18) so as to alter the power environment while the power source (1) is operating.

Figure 3:
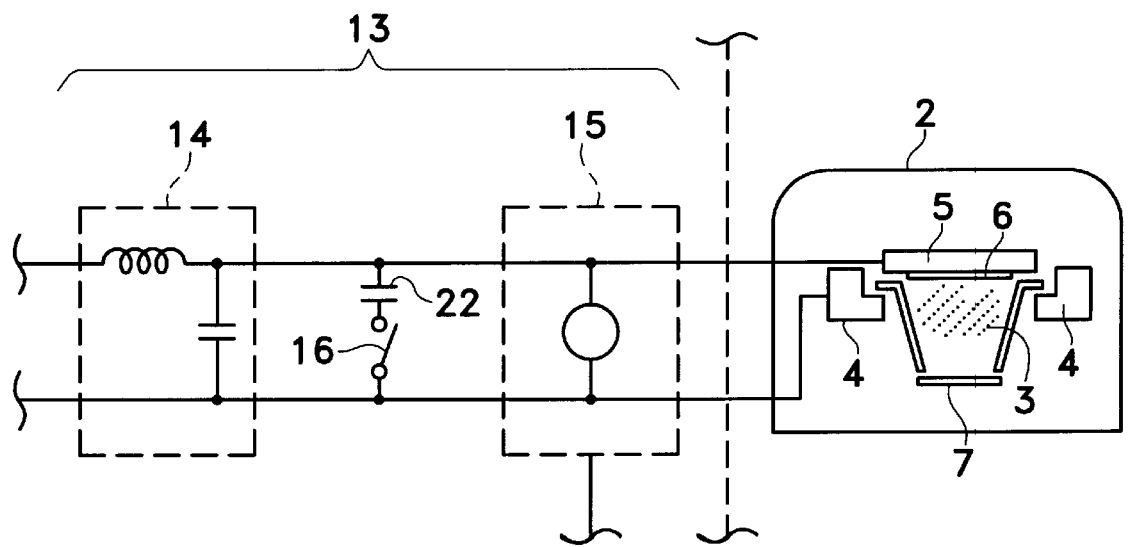
FIG. 3 is a schematic diagram of a parallel capacitor component configured to implement the invention.
Figure 4:
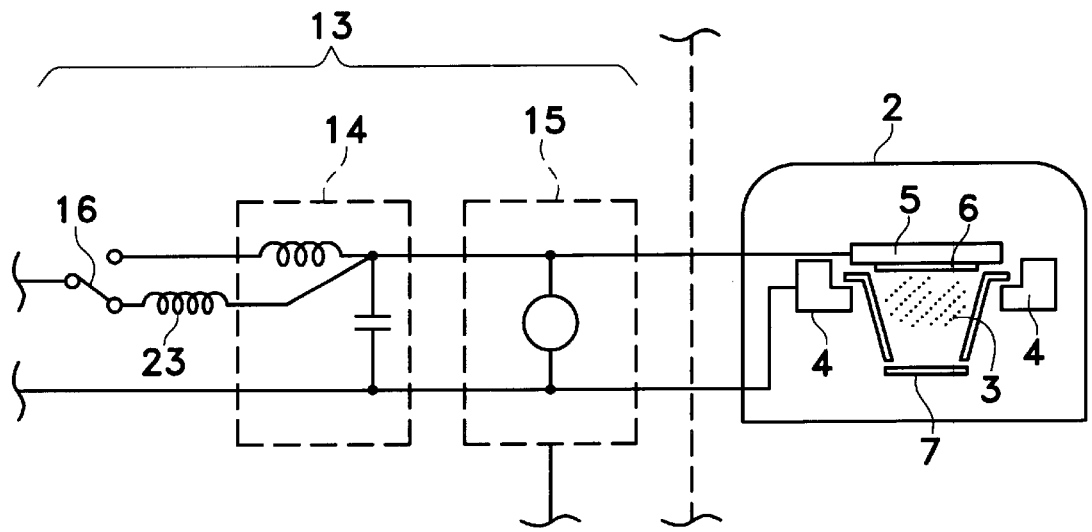
FIG. 4 is a schematic diagram of a series inductor component configured to implement the invention.

As shown in FIGS. 3 and 4, two of many other alternatives include the utilization of energy storage elements to alter the energy quantum. FIG. 3 shows one component such as a capacitive element (22) to be alternatively included or excluded from the circuit through the utilization of switch (16). As shown, the capacitor may be configured in parallel to the capacitor traditionally used in a filter (14) so as to alter the energy storage capability of the output stage (13). Thus, the circuitry of power source (1) is altered in a different configuration. As those skilled in the art would readily understand the capacitive element (22) is shown as being configured in parallel with the anode (4) and cathode (5) as appropriate for a DC source.

Alternatively, and as shown in FIG. 4, an additional inductive element (23) may be included. Again, through the utilization of switch (16), the inductive element may be allowed to store energy and thus increase the energy storage of output stage (13) to achieve not only an alteration of the circuitry of the power source (1) but also an adjustment of the energy quantum involved. As shown and as those skilled in the art would readily appreciate, this inductive element (23) may be configured in series with the anode (4) and cathode (5) for a DC application.

Yet another way to achieve the broad goal of adjusting the energy quantum is through the use of adjusting the various thresholds involved. As is well known, most power supplies involve either or both a current or voltage threshold level above or below which operation is automatically adjusted or stopped. Through the adjustment of these levels an adjustment of the energy quantum can be effectively achieved. Thus by establishing different current or voltage threshold levels, different power environments may be created. Again, this may be achieved during operation of the power supply and may be as simple as increasing the current threshold level at which an over current limit is determined to exist. Again, this may be achieved through either hardware or software configurations and may be easily achieved through a programmable processor (21) as shown in FIG. 2.

Figure 5:
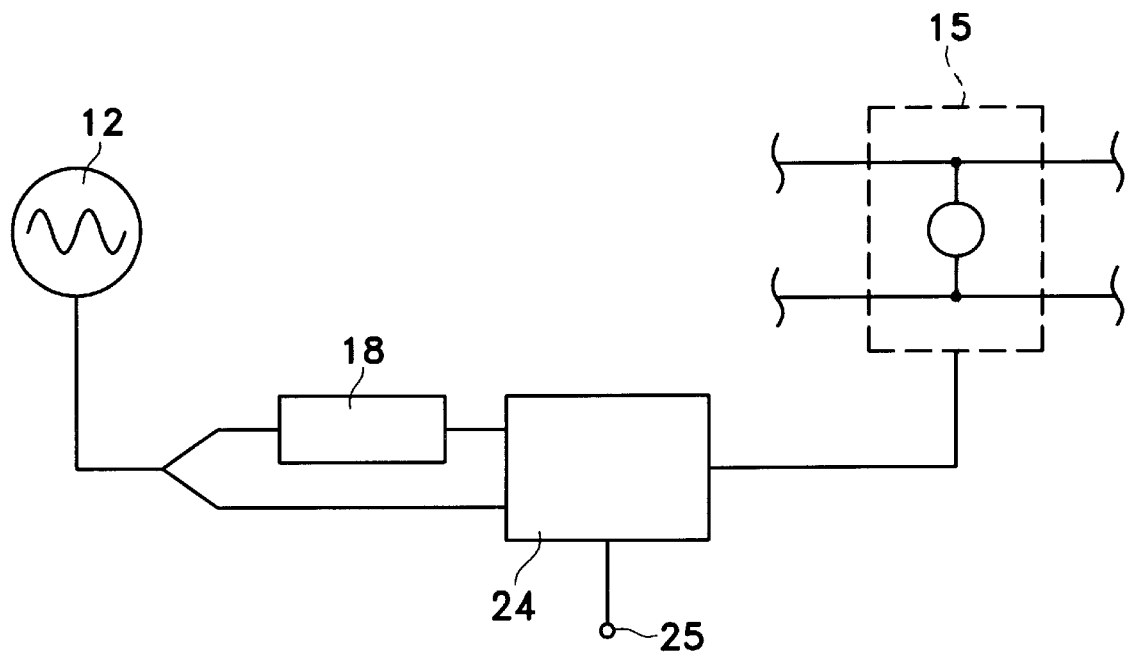
FIG. 5 is a schematic diagram of an automatic switching design according to the invention.

Finally, the present invention provides for both manual or automatic operation. In this fashion the determination as to when to switch between various environments or various circuities may be achieved based on operator input or may be achieved automatically. Manual operation can involve merely switching between environments when desired. It may also involve adjusting levels for maximum throughput and the like. The automatic operation may involve the inclusion of a processing timer element (24) as shown in FIG. 5. Through this configuration, an arrangement such as that shown in FIG. 1 might be controlled by processing timer element (24) to act to automatically change environments. Through some type of reset input the operation of replacing or including a new or unconditioned material (6) can be indicated. This reset (25) may act to reestablish processing timer element (24) so as to trigger switch (16) to activate one or the other environment or circuitry or control system depending upon the application. In this fashion processing timer element (24) may act to allow conditioning for a set period of time (i.e. so many minutes) before automatically switching to the processing environment such as through the activation of the processing circuitry (19). This arrangement could act to control the amount of time the system is subjected to a conditioning environment. It could also be arranged to start a conditioning mode automatically on system start-up.

Alternatively, feedback sensing system (15) can be used to sense at least one electrical condition of the plasma. This electrical condition could then be provided as an output to be analyzed to determine when a switch between the two environments is appropriate. Such an electrical condition may include as subtle a condition as a harmonic impedance or may be as simple as measuring the frequency of arc occurrences. Through such a design the first and second power control system may be responsive to the processing timer element (24) and to some type of sensor (15). As those having ordinary skill in the art would easily understand, this sensor may also include a simple arc detector which may take a variety of forms including but not limited to a mere over-current sensor. In keeping with the broad scope of this patent, it should be understood that the processing timer element (24) may be configured in a variety of ways including hardware or software configurations. As shown in FIG. 2 and as those ordinarily skilled in the art would readily appreciate, programmable processor (21) may also be utilized to establish a software arrangement whereby not only the amount of time delay is controlled but also the amount of time for a particular environment is controlled. Thus the terms "timer", "delay circuitry", and "programmable processor" should be recognized to be very broad in nature and to encompass each other as the result is what is intended to be encompassed not merely a particular arrangement for achieving the result.

The foregoing discussion and the claims which follow describe the preferred embodiments of the present invention. Particularly with respect to the claims it should be understood that changes may be made without departing from the essence of this invention. In this regard it is intended that such changes would still fall within the scope of the present invention. It is simply not practical to describe and claim all possible revisions which may be accomplished. To the extent such revisions utilize the essence of the present invention, each naturally falls within the breath of protection encompassed by this patent. This is particularly true for the present invention since its basic concepts and understandings are fundamental in nature and can be applied broadly in a variety of ways. Further, it should be understood that various permutations and combinations of the elements shown in the claims are possible and should fall within the scope of this disclosure.

I claim:

1. A method of multiple power non arc-based plasma processing comprising steps of:
   a. supplying a solid material within a coating chamber;
   b. creating a processing plasma by utilizing a switch-mode power supply which processes an area of said material within said coating chamber comprising steps of:
      i. supplying a DC input voltage;
      ii. generating an alternating signal from said DC input voltage;
      ii. converting said alternating signal to a DC output; and
      iv. applying said DC output to said processing plasma;
   c. establishing a first operating power environment for said processing plasma through utilization of said switch-mode power supply wherein said first power environment has an arc energy quantum which begins to discharge upon an arc occurrence and which is preparatory to non arc-based processing; and
   d. switching from said first operating power environment to establish a second operating power environment for said processing plasma which is powered by said switch-mode power supply wherein said second power environment has a different arc energy quantum which begins to discharge upon said arc occurrence and wherein at least said second power environment achieves said non arc-based processing, and wherein each of said first and said second operating power environments act to affect said solid material.

2. A method of multiple power non arc-based plasma processing as described in claim 1 wherein said step of switching said power to establish said second power environment for said processing plasma occurs during the processing of said material.

3. A method of multiple power non arc-based plasma processing as described in claim 1 further comprising applying said non arc-based processing to a substrate within said coating chamber primarily through action of said second power environment.

4. A method of multiple power non arc-based plasma processing as described in claim 2 wherein said step of switching from said first power environment to establish said second power environment for said processing plasma comprises a step of adjusting said energy quantum of said first power environment.

5. A method of multiple power non arc-based plasma processing as described in claim 3 wherein said step of switching from said first power environment to establish said second power environment for said processing plasma comprises a step of adjusting said energy quantum of said first power environment.

6. A method of multiple power non arc-based plasma processing as described in claim 1 wherein each said power environment has a reaction time in which said switch-mode power supply responds to an arc occurrence and wherein said step of switching from said first power environment to establish said second power environment for said processing plasma comprises a step of changing said reaction time.

7. A method of multiple power non arc-based plasma processing as described in claim 1 wherein each said power environment has a current threshold level and wherein said step of switching from said first power environment to establish said second power environment for said processing plasma comprises a step of adjusting said current threshold level.

8. A method of multiple power non arc-based plasma processing as described in claim 1 wherein each said power environment has a voltage threshold level and wherein said step of switching from said first power environment to establish said second power environment for said processing plasma comprises a step of adjusting said voltage threshold level.

9. A method of non arc-based plasma processing as described in claim 1 wherein said step of switching from said first operating power environment occurs while processing said material.

10. A method of non arc-based plasma processing as described in claim 9 wherein said first power environment has a reaction time in which said switch-mode power supply responds to an arc occurrence and wherein said step of switching said energy quantum of said power environment while processing said material comprises a step of changing said reaction time.

11. A method of non arc-based plasma processing as described in claim 9 wherein said power environment has a current threshold level at which operation of said first power environment is adjusted and wherein said step of switching from said first operating power environment while processing said material comprises a step of changing said current threshold level at which operation of said power environment is adjusted.

12. A method of non arc-based plasma processing as described in claim 9 wherein said first power environment has a voltage threshold level at which operation of said first power environment is adjusted and wherein said step of switching from said first operating power environment while processing said material comprises a step of changing said voltage threshold level at which operation of said power environment is adjusted.

13. A method of multiple power non arc-based plasma processing as described in claim 5 wherein each said power environment has a reaction time in which said switch-mode power supply responds to an arc occurrence and wherein said step of switching from said first power environment to establish a second power environment for said processing plasma comprises a step of changing said reaction time.

14. A method of multiple power non arc-based plasma processing as described in claim 1 wherein said step of creating said processing plasma which processes said area of said material within said coating chamber is accomplished through use of said switch-mode having a reaction time in which said switch-mode power supply responds to said arc occurrence and wherein said step of switching from said first power environment to establish said second power environment for said processing plasma comprises a step of changing said reaction time.

15. A method of multiple power non arc-based plasma processing as described in claim 1 wherein said step of establishing said first power environment for said processing plasma is accomplished through use of said switch-mode power supply and an energy storage element and wherein said step of switching comprises a step of physically altering said energy storage element.

16. A method of multiple power non arc-based plasma processing as described in claim 5 wherein said step of establishing said first power environment for said processing plasma is accomplished through use of said switch-mode power supply and an output energy storage capability and wherein said step of switching comprises a step of physically altering said energy storage capability.

17. A method of multiple power non arc-based plasma processing comprising steps of:
 a. supplying a solid material within a coating chamber containing electrodes;
 b. applying power to said electrodes in said coating chamber by utilizing a switch-mode power supply comprising steps of:
  i. accepting a DC input voltage;
  ii. generating an alternating signal from said DC input voltage;
  iii. converting said alternating signal to a DC output; and
  iv. applying said DC output to said electrodes in said coating chamber;
 c. creating a processing plasma which affects an area of said material within said coating chamber and wherein said area presents an initial varying impedance across said area;
 d. subjecting said material to a conditioning environment having an operating power within said coating chamber through utilization of said switch-mode powers and which acts to make said material present a more uniform impedance relative to said initial varying impedance across said area;
 e. switching from said conditioning environment to create a plasma processing environment within said coating chamber and which is powered by said switch-mode power supply; and
 f. non arc-based processing a substrate within said coating chamber primarily through action of said processing environment, and
wherein each of said conditioning environment and said plasma processing environment act to affect said solid material.

18. A method of multiple power non arc-base plasma processing as described in claim 17 wherein said material has localized low impedance areas compared to a surrounding area and wherein said step of subjecting said material to said conditioning environment within said coating chamber comprises a step of eliminating said localized low impedance areas.

19. A method of multiple power non arc-based plasma processing as described in claim 17 wherein said conditioning environment is created by adjusting said power.

20. A method of multiple power non arc-based plasma processing as described in claim 17 wherein said conditioning environment and said processing environment each have an arc energy quantum which begins to discharge upon an arc occurrence and wherein said step of switching from said conditioning environment to create said processing environment within said coating chamber comprises a step of adjusting said energy quantum.

21. A method of multiple power non arc-based plasma processing as described in claim 20 wherein the energy quantum of said conditioning environment is greater than the energy quantum of said processing environment.

22. A method of multiple power non arc-based plasma processing as described in claim 17 wherein said step of applying said dc output to said electrodes in said coating chamber is accomplished through use of said switch-mode power supply having a reaction time in which said switch-mode power supply responds to an arc occurrence and wherein said step of switching to create said plasma processing environment within said coating chamber comprises a step of changing said reaction time.

23. A method of multiple power non arc-based plasma processing as described in claim 20 wherein said conditioning environment has a reaction time in which said switch-mode power supply responds to an arc occurrence and wherein said step of adjusting said energy quantum comprises a step of changing said reaction time.

24. A method of multiple power non arc-based plasma processing as described in claim 17 wherein said step of applying said dc output to said electrodes in said coating chamber is accomplished through use of said switch-mode power supply and an energy storage element and wherein said step of switching comprises a step of physically altering said energy storage element.

25. A method of multiple power non arc-based plasma processing as described in claim 20 wherein said step of applying said DC output to said electrodes in said coating chamber is accomplished through use of said switch-mode power supply and an output energy storage capability and wherein said step of adjusting said energy quantum comprises a step of physically altering said energy storage capability.

26. A method of multiple power non arc-based plasma processing as described in claim 1, 4, or 17 and further comprising a step of determining when to accomplish said step of switching.

27. A method of multiple power non arc-based plasma processing as described in claim 26 wherein said step of determining when to accomplish said step of switching comprises a step of controlling an amount of time said material is subjected to at least one of said environments.

28. A method of multiple power non arc-based plasma processing as described in claim 26 wherein said plasma has at least one electrical condition and wherein said step of determining when to accomplish said step of switching comprises a step of sensing said electrical condition of said plasma.

29. A method of multiple power non arc-based plasma processing as described in claim 26 wherein said plasma has arc occurrences and wherein said step of determining when to accomplish said step of switching comprises a step of measuring a frequency of said arc occurrences within said plasma.

30. A method of multiple power non arc-based plasma processing as described in claim 26 and further comprising a step of indicating for manual operation when to accomplish said step of switching.

31. A method of multiple power non arc-based plasma processing as described in claim 26 wherein said step of switching is accomplished automatically.

32. A method of non arc-based plasma processing comprising steps of:
   a. supplying a solid material within a coating chamber containing electrodes;
   b. applying power to said electrodes in said coating chamber;
   c. creating a processing plasma which processes said material to achieve non-arc based processing within said coating chamber;
   d. subjecting said processing plasma to an operating power environment through utilization of a switch-mode power supply having a reaction time in which said switch-mode power supply responds to an arc occurrence; and
   e. changing said reaction time of said operating power environment wherein at least one said reaction time exists during said non-arc based processing, and
wherein each operating power environments act to affect said solid material.

33. A method of non arc-based plasma processing as described in claim 32 wherein said step of changing said reaction time of said power environment occurs while processing said material.

* * * * *